(12) United States Patent
Wagner et al.

(10) Patent No.: US 10,725,138 B2
(45) Date of Patent: Jul. 28, 2020

(54) SCATTERING PARAMETER CALIBRATION TO A SEMICONDUCTOR LAYER

(71) Applicant: Infineon Technologies AG, Neubiberg (DE)

(72) Inventors: Christoph Wagner, Enns (AT); Oliver Frank, Linz (AT); Jochen Schrattenecker, Reichenthal (AT); Harald Kainmueller, Lasberg (AT)

(73) Assignee: Infineon Technologies AG, Neubiberg (DE)

( * ) Notice: Subject to any disclaimer, the term of this patent is extended or adjusted under 35 U.S.C. 154(b) by 657 days.

(21) Appl. No.: 15/352,233

(22) Filed: Nov. 15, 2016

(65) Prior Publication Data

US 2017/0168132 A1 Jun. 15, 2017

Related U.S. Application Data

(60) Provisional application No. 62/266,132, filed on Dec. 11, 2015.

(51) Int. Cl.
| | |
|---|---|
| *G01R 35/00* | (2006.01) |
| *G01R 31/28* | (2006.01) |
| *G01R 27/28* | (2006.01) |
| *G01R 27/02* | (2006.01) |
| *G01R 27/26* | (2006.01) |
| *G01R 31/319* | (2006.01) |

(Continued)

(52) U.S. Cl.
CPC ........... *G01R 35/005* (2013.01); *G01R 27/02* (2013.01); *G01R 27/2605* (2013.01); *G01R 27/28* (2013.01); *G01R 31/2851* (2013.01); *G01R 31/3191* (2013.01); *G01R 35/00* (2013.01); *G01R 35/007* (2013.01); *H01L 23/66* (2013.01); *G01R 27/32* (2013.01); *G01R 31/2853* (2013.01); *H01L 2223/6605* (2013.01); *H01L 2223/6644* (2013.01); *H01L 2223/6683* (2013.01)

(58) Field of Classification Search
CPC ...... G01R 35/005; G01R 35/00; G01R 27/28; G01R 27/02; G01R 27/2605; G01R 31/3191
USPC ............................... 324/750.02, 601; 702/85
See application file for complete search history.

(56) References Cited

U.S. PATENT DOCUMENTS

| | | | | |
|---|---|---|---|---|
| 5,561,377 A | * | 10/1996 | Strid ...................... | B82Y 15/00 324/73.1 |
| 6,146,908 A | * | 11/2000 | Falque ................ | G03F 7/70425 438/11 |

(Continued)

OTHER PUBLICATIONS

Cascade Microtech, Inc., "Advanced RF Calibration Techniques with Cascade Microtech's Pyramid Probe," https://www.cascademicrotech.com/files/LRRMCAL_AN.pdf, 2009, 6 pages.

(Continued)

*Primary Examiner* — Raul J Rios Russo
(74) *Attorney, Agent, or Firm* — Harrity & Harrity, LLP

(57) ABSTRACT

A compound may include a set of integrated circuits. An integrated circuit, of the set of integrated circuits, may include calibration standards integrated at a silicon layer of the integrated circuit. The integrated circuit may be included in a package, and a calibration standard, of the calibration standards, may be available to at least one port of a set of ports of the integrated circuit.

20 Claims, 4 Drawing Sheets

(51) Int. Cl.
*H01L 23/66* (2006.01)
*G01R 27/32* (2006.01)

(56) References Cited

U.S. PATENT DOCUMENTS

| | | | |
|---|---|---|---|
| 6,480,013 B1* | 11/2002 | Nayler | G01R 31/2886 324/750.02 |
| 6,794,889 B2 | 9/2004 | Jafari et al. | |
| 7,504,822 B2 | 3/2009 | Parrish et al. | |
| 8,531,202 B2 | 9/2013 | Mok et al. | |
| 2004/0150411 A1* | 8/2004 | Liu | G01R 27/28 324/601 |
| 2005/0187743 A1* | 8/2005 | Pleasant | G06F 17/5036 703/2 |
| 2006/0249840 A1* | 11/2006 | Sutardja | G11O 5/00 257/729 |
| 2007/0013388 A1* | 1/2007 | Wang | G05B 19/401 324/601 |
| 2007/0030012 A1* | 2/2007 | Kamitani | G01R 27/28 324/601 |
| 2011/0254536 A1* | 10/2011 | Zelder | G01R 27/32 324/74 |
| 2013/0002272 A1* | 1/2013 | Badaroglu | G01R 31/318513 324/750.01 |
| 2013/0317767 A1* | 11/2013 | Mori | G01R 27/28 702/57 |
| 2014/0176156 A1* | 6/2014 | Pupalaikis | G06F 19/00 324/601 |

OTHER PUBLICATIONS

Pozar, "Microwave Engineering," John Wiley & Sons, Inc., Fourth Edition, 2012, 756 pages.

* cited by examiner

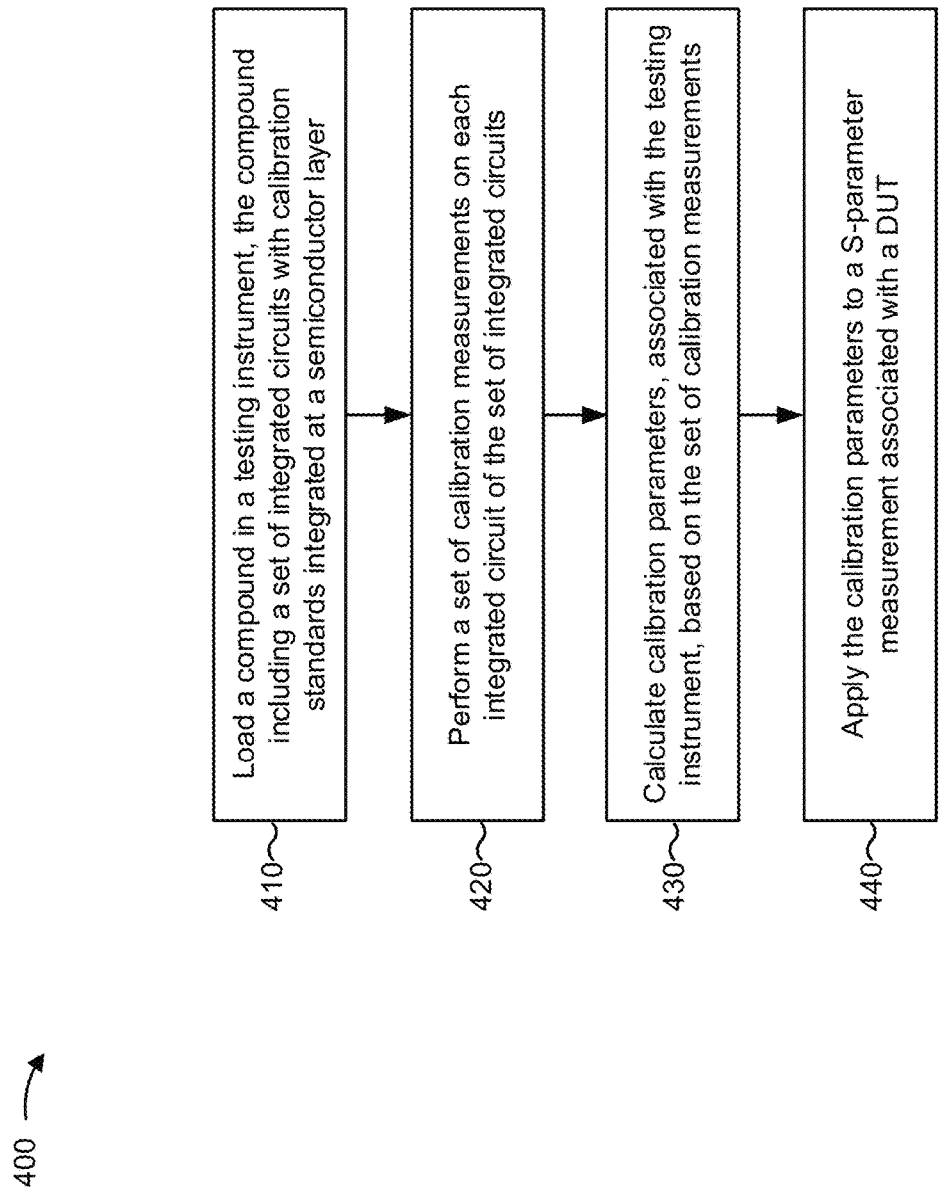

SCATTERING PARAMETER CALIBRATION TO A SEMICONDUCTOR LAYER

RELATED APPLICATION

This application claims priority under 35 U.S.C. § 119 to U.S. Provisional Patent Application No. 62/266,132, filed on Dec. 11, 2015, the content of which is incorporated by reference herein in its entirety.

BACKGROUND

Scattering parameters (S-parameters) describe electrical behavior of a linear electrical network when undergoing various steady state stimuli by electrical signals. The scattering parameters may be represented as elements of a scattering matrix (S-matrix).

A testing instrument may be designed to measure S-parameters of a device-under-test (DUT). The testing instrument may need to be calibrated before measuring the S-parameters of the DUT in order to correct for losses, phase delays, or the like, caused by the testing instrument during measurement.

SUMMARY

According to some possible implementations, a compound may include: a set of integrated circuits, where an integrated circuit, of the set of integrated circuits, may include calibration standards integrated at a silicon layer of the integrated circuit, where the integrated circuit may be included in a package, and where a calibration standard, of the calibration standards, may be available to at least one port of a set of ports of the integrated circuit.

According to some possible implementations, an integrated circuit associated with calibrating a testing instrument, may include: a set of calibration standards integrated at a semiconductor layer of the integrated circuit, where the semiconductor layer may be lower than a surface of a package of the integrated circuit, and where at least one of the calibration standards, of the set of calibration standards, may be coupled to a port of a set of ports of the integrated circuit, where the set of ports may permit a set of measurements to be made relating to the set of calibration standards.

According to some possible implementations, a method may include: performing, by a device, a set of calibration measurements using a set of integrated circuits on a compound, where an integrated circuit, of the set of integrated circuits, may include a plurality of calibration standards integrated at a functional layer of the integrated circuit, where the plurality of calibration standards may permit a calibration measurement, of the set of calibration measurements, to be performed at the functional layer of the integrated circuit; calculating, by the device and based on the set of calibration measurements, correction parameters associated with calibrating a testing instrument; and applying, by the device, the correction parameters to a measurement associated with the testing instrument.

BRIEF DESCRIPTION OF THE DRAWINGS

FIG. 4 is a flow chart of an example process for calibrating a testing instrument using a compound including a set of integrated circuits with calibration standards integrated at a semiconductor layer.

DETAILED DESCRIPTION

Figure 1A:
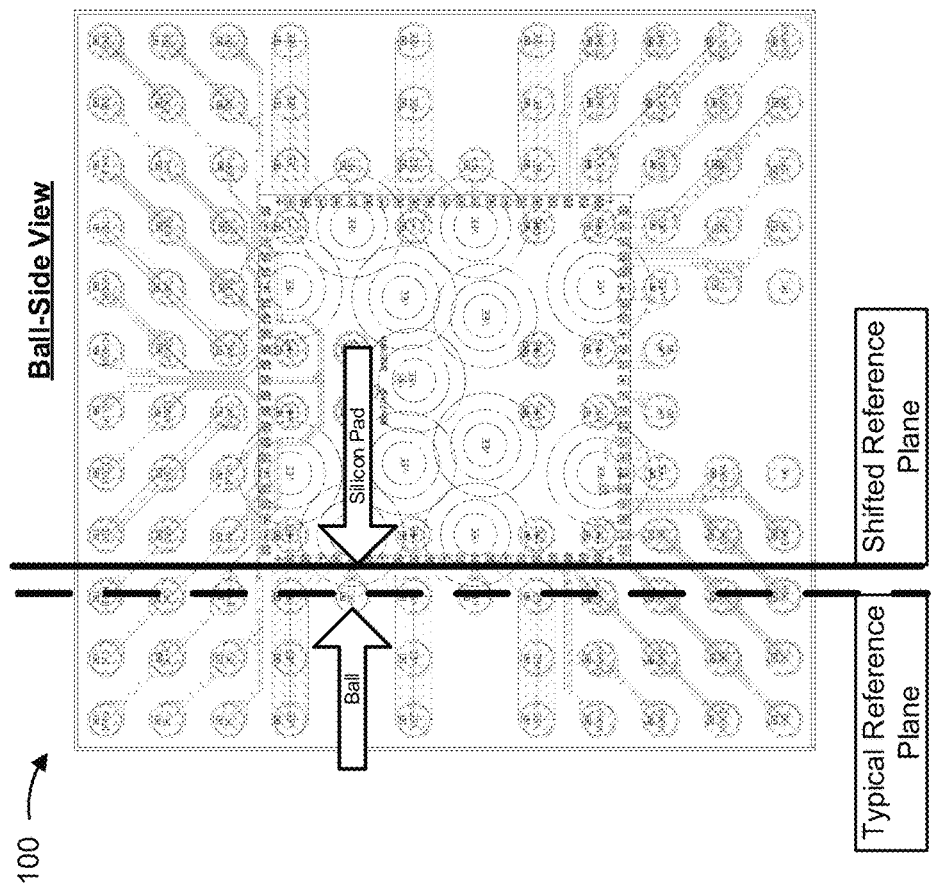
FIGS. 1A and 1B are diagrams of an overview of an example implementation described herein.

The following detailed description of example implementations refers to the accompanying drawings. The same reference numbers in different drawings may identify the same or similar elements.

A testing instrument (e.g., automated test equipment (ATE) including a tester, a test head, a probe card, a prober, etc.) may be capable of measuring S-parameters of a device-under-test (DUT) (e.g., an integrated circuit (IC) or "chip" on a test wafer). However, before measuring the S-parameters of the DUT, the testing instrument may need to be calibrated to correct for systematic errors, associated with the testing instrument, that may affect the measurement of the S-parameters. The testing instrument may be calibrated to a reference plane that represents a location at which path losses from the testing instrument and/or a probing technology, implemented in the testing instrument, are known. For example, the testing instrument may be calibrated such that the reference plane is located at an electrical access layer (e.g., a ball layer, a lead layer, a layer including electrical contacts, etc.) in a package on which the DUT is mounted (e.g., a case that houses the DUT and/or supports electrical contacts with the DUT).

A result of the calibration may include correction parameters that can be applied to S-parameters that are later measured by the testing instrument. For example, after determination of the correction parameters during calibration, the testing instrument may measure the S-parameters of the DUT, and may apply the correction parameters to the measured S-parameters in order to increase accuracy of the measured S-parameters (e.g., by correcting for the systematic errors associated with the testing instrument).

A typical calibration of the testing instrument may use a reference plane located at a point of physical access that is reachable by the testing instrument. For example, as described above, the calibration may use the electrical access layer of the package as the reference plane (e.g., where the testing instrument makes physical contact with solder balls of the package, leads of the package, etc.). However, direct comparability between a measurement by the testing instrument and a circuit simulation, a bare die, an integrated circuit layout, or the like, may not be possible when the reference plane is at the electrical access layer of the package (e.g., since the package may affect the correction parameters). Additionally, an ability to detect a package defect and/or to characterize a voltage signal chain (e.g., especially the package), may not be possible when the reference plane is at the electrical access layer of the package. As such, it may be beneficial for the reference plane to be located such that these advantages may be realized, even though such a location (e.g., a semiconductor layer of the package, such as a silicon layer) is not physically accessible by the testing instrument.

Further, the calibration procedure may make use of calibration standards (e.g., mounted on a printed circuit board (PCB)) that are typically available with a particular impedance, such as 50 Ohms. Therefore, for a package that does not have a 50 Ohm impedance (e.g., a monolithic microwave integrated circuit (MMIC) package), matching structures may be needed in the measurement path after calibration. In some cases, use of such matching structures may be complicated, spacious, not production stable, and/or may induce additional losses and/or measurement inaccuracies which may need to be overcome (e.g., by over-designing the instrument, which may limit parallelism). As such, it may be advantageous to provide for calibrated S-parameter measurement on a package with an arbitrary impedance (i.e., an impedance that is or is not 50 Ohms) without using matching structures. Moreover, the available calibration standards may not mechanically match the instrument (e.g., a probe and pinout of the testing instrument) which increases a risk of damage to the testing instrument.

Implementations described herein may allow a testing instrument to be calibrated to a reference plane at a location for which the testing instrument does not have physical access (e.g., a semiconductor layer of the package) for measurement of S-parameters. This may allow for improved comparability associated with measurements of the testing instrument, improved detection of a package defect, and/or improved characterization of a voltage signal chain associated with the measurement. Implementations described herein may also enable calibrated S-parameter measurement for a package with an arbitrary impedance, thereby eliminating a need for matching structures in the measurement path.

Figure 1B:
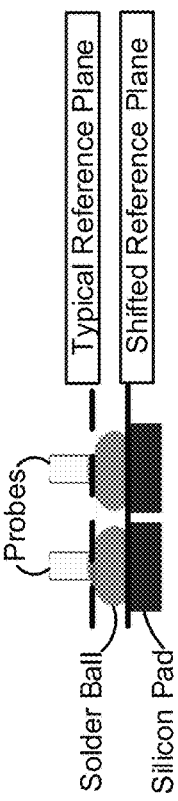

FIGS. 1A and 1B are diagrams of an overview of an example implementation 100 described herein. For the purposes of example implementation 100, assume that a testing instrument is to be calibrated in order to measure S-parameters of a MMIC in a package (e.g., an Embedded Wafer Level Ball Grid Array (eWLB) based package), as shown in FIG. 1A.

As shown, a typical reference plane, associated with calibrating the testing instrument, may be located at an electrical access layer (e.g., a ball layer) of the MMIC package. For example, as shown by the dashed lines in FIGS. 1A and 1B, the typical reference plane may be located on the ball layer of the package with respect to a surface of the MMIC package. In other words, the typical reference plane may be located at point at which the testing instrument physically contacts the MMIC package (e.g., where probes of the testing instrument contact the balls of the package during measurement). However, as described above, direct comparability between a measurement by the testing instrument and a circuit simulation, a bare die, an integrated circuit layout, or the like, as well as an ability to detect a package defect, and/or to characterize a voltage signal chain may not be possible when the reference plane is located at the ball layer of the package.

In order to realize these advantages, the reference plane may be shifted to the semiconductor layer (e.g., the silicon layer) of the package (i.e., a point at which that testing instrument does not have physical access). For example, as shown by the solid lines in FIGS. 1A and 1B, the reference plane may be shifted such that the reference plane is located on the silicon layer of the package. In other words, the reference plane may be shifted to a silicon layer that is lower than a ball layer with respect to a surface of the MMIC package.

Here, the reference plane may be shifted by using a compound, such as a calibration wafer, to calibrate the testing instrument. The compound may include integrated circuits with calibration standards integrated at a silicon layer. The integrated circuits of the compound may be packaged in a same package type (e.g., ball-out, etc.) and technology (e.g., B7, B11, etc.) as the MMIC for which S-parameters are to be measured by the testing instrument. Use of such a compound allows the reference plane of the calibration to be located at the silicon layer (e.g., rather than the ball layer).

Furthermore, use of the compound (e.g., including the calibration standards integrated at the silicon layer) may also provide for calibrated S-parameter measurement without the use of matching structures. For example, the calibration standards integrated in the compound may be designed with any impedance (e.g., 40 Ohms, 75 Ohms, etc.). As such, typically available calibration standards (e.g., with 50 Ohm impedance) need not be used when calibrating the testing instrument, thus eliminating a need for matching structures in the measurement path. Additional details regarding the compound are described below.

Notably, while examples described herein are described in the context of a MMIC and an eWLB based package, other examples are possible using other types of integrated circuits and/or other types of packaging.

Figure 2:
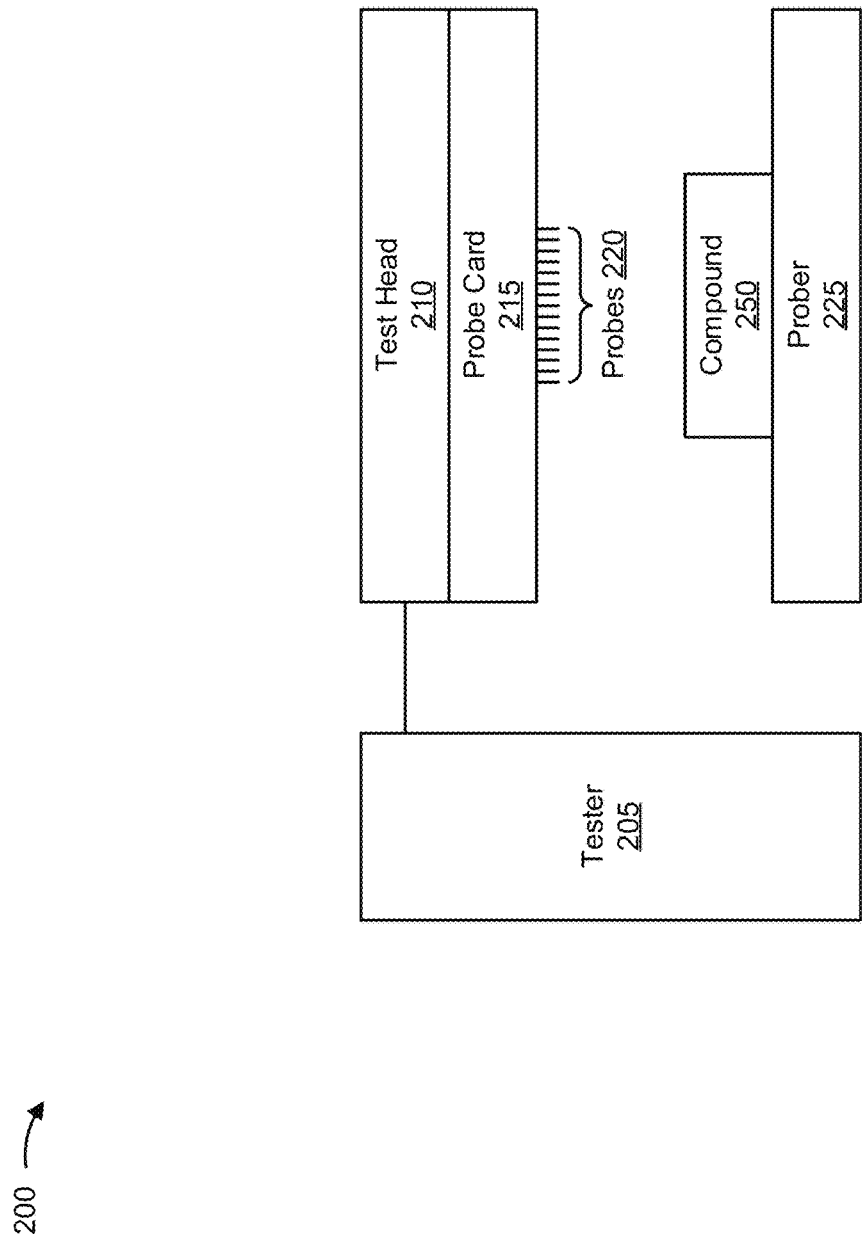
FIG. 2 is a diagram of an example testing instrument in which a compound may be used for calibration, as described herein.

FIG. 2 is a diagram of an example testing instrument 200 for which a compound may be used for calibration, as described herein. As shown in FIG. 2, testing instrument 200 may include a tester 205, a test head 210, a probe card 215 including probes 220, and a prober 225. As further shown in FIG. 2, testing instrument 200 may operate upon a compound 250.

Tester 205 may include a device, such as a computing device, that controls, operates, manages, or the like, testing instrument 200, such as during calibration of testing instrument 200, measurement of S-parameters of a DUT, or the like. As shown, tester 205 may be connected to test head 210.

Test head 210 may include a moveable device that may be positioned over compound 250 (e.g., during calibration of testing instrument 200) or the DUT (e.g., after calibration of testing instrument 200). Test head 210 may make contact with compound 250 via probes 220 of probe card 215. As shown, in some implementations, probe card 215 may be attached to test head 210. Probe card 215 may include a device that acts as an interface between test head 210 and compound 250 and may include probes 220 that may contact compound 250 during calibration of testing instrument 200. In some implementations, probe card 215 may include a pyramidal probe card or another type of probe card. Probes 220 may include probes, such as needle probes, to perform measurements on compound 250 during calibration of testing instrument 200.

Prober 225 may load and unload compound 250 onto or from a prober stage of prober 225. The prober stage may move compound 250 into position for calibration of testing instrument 200, and may be capable of moving in an x-direction, a y-direction, and a z-direction.

Compound 250 may include calibration standards integrated at a semiconductor layer. For example, one or more integrated circuits of compound 250 may include one or more calibration standards integrated at the semiconductor layer. In some implementations, the semiconductor layer may be comprised of a semiconductor material, such as silicon, germanium, gallium, and/or another type of semiconductor material. In some implementations, compound 250 may include a wafer, a square, a rectangular, or another type of compound in which calibration standards may be integrated at a semiconductor layer.

In some implementations, the calibration standards may be integrated at the semiconductor layer, as described above. Additionally, or alternatively, the calibration standards may be integrated at a functional layer of the integrated circuit that comprises the semiconductor layer, an active area of a metal layer of the integrated circuit, or a combination of the semiconductor layer and the active area of the metal layer.

In some implementations, the integrated circuits of compound 250 may be packaged in a same package type (e.g., ball-out, etc.) and technology (e.g., B7, B11, etc.) as the DUT that is to be measured by testing instrument 200. As described above, packaging the integrated circuits (e.g., including the calibration standards) in the same package type and technology as the DUT shifts the reference plane of the calibration, as well as measurements by testing instrument 200, to be at the semiconductor layer (e.g., rather than the electrical access layer).

In some implementations, the calibration standards may be associated with a particular calibration method to be implemented when calibrating testing instrument 200. For example, the calibration standards may include calibration standards associated with one or more calibration methods, such as calibration standards associated with a short-open-load-through (SOLT) calibration method, a through-reflect-line (TRL) calibration method, a line-reflect-match (LRM) calibration method, a line-reflect-reflect-match (LRRM) calibration method, a short-open-load-reflect (SOLR) calibration method, a short-open-load (SOL) calibration method, a short-open (SO) calibration method, or another type of calibration method.

In some implementations, compound 250 may be loaded on testing instrument 200 in order to perform calibration of testing instrument 200. Additional details regarding compound 250 are described below with regard to FIG. 3.

The number and arrangement of devices shown in FIG. 2 are provided as an example. In practice, there may be additional devices, fewer devices, different devices, or differently arranged devices than those shown in FIG. 2. Furthermore, two or more devices shown in FIG. 2 may be implemented within a single device, or a single device shown in FIG. 2 may be implemented as multiple, distributed devices. Additionally, or alternatively, a set of devices (e.g., one or more devices) of testing instrument 200 may perform one or more functions described as being performed by another set of devices of testing instrument 200.

Figure 3:
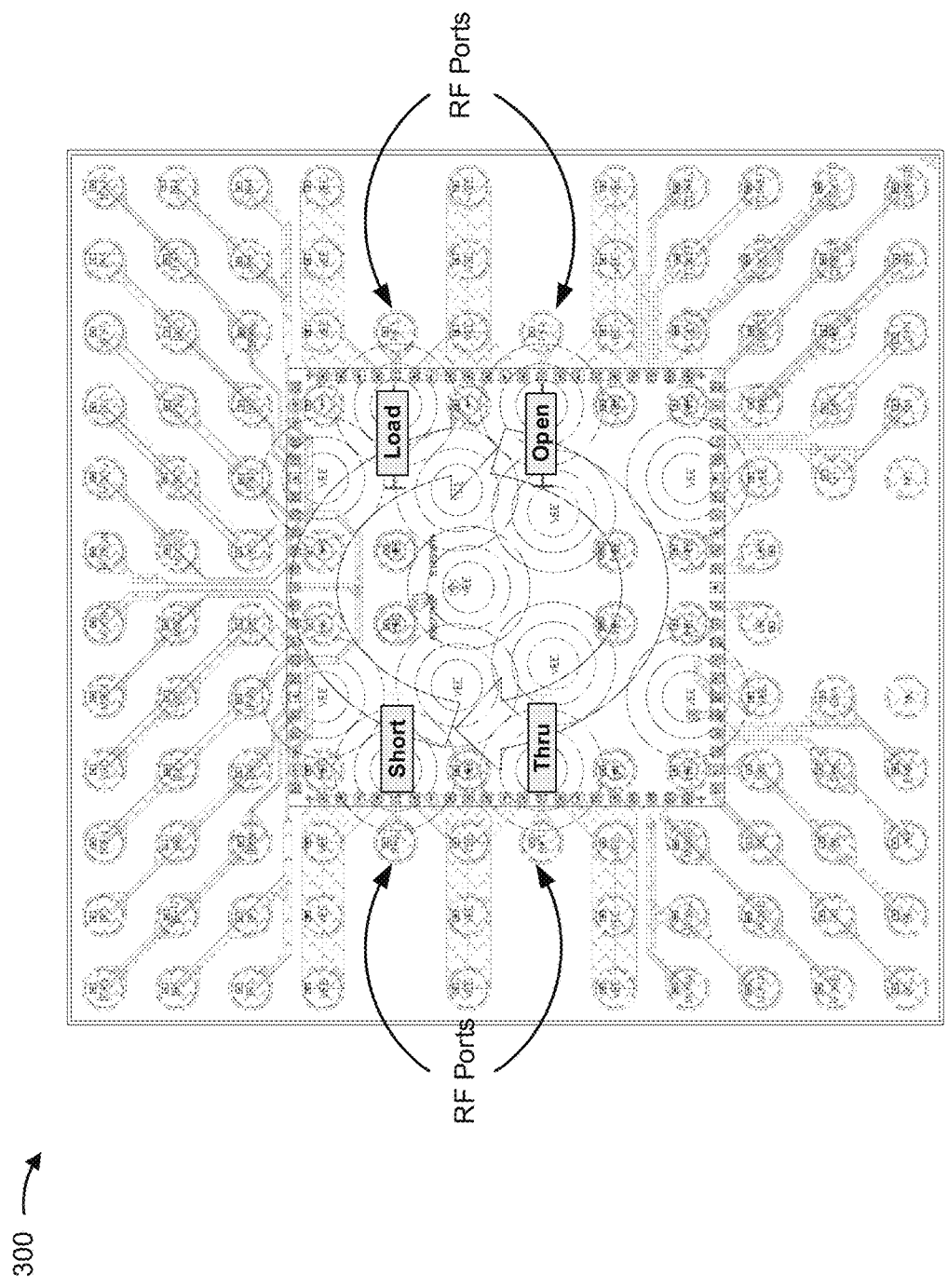
FIG. 3 is a diagram of an example integrated circuit of a compound including a set of calibration standards associated with calibrating a testing instrument.

FIG. 3 is a diagram of an example integrated circuit 300 of compound 250 including a set of calibration standards associated with calibrating testing instrument 200. For the purposes of FIG. 3, assume that the DUT is a MMIC packaged in a eWLB based package. Further, assume that the SOLT calibration method is to be used to calibrate testing instrument 200.

As shown in FIG. 3, integrated circuit 300 may include a set of calibration standards associated with the SOLT calibration method. For example, as shown, integrated circuit 300 may include a short standard, an open standard, a load standard, and a through standard. In some implementations, a calibration standard may include a load with a known characteristic, such as a particular impedance. In some implementations, the calibration standards of integrated circuit 300 may be integrated at the semiconductor layer of integrated circuit 300 (e.g., the silicon layer). In some implementations, each calibration standard of integrated circuit 300 may be placed at an RF port. For example, as shown in FIG. 3, the short, open, load, and through standards may each be placed at a respective RF port that allows testing instrument 200 to provide a voltage signal to integrated circuit 300.

In some implementations, some integrated circuits 300 of compound 250 may include different combinations of calibration standards and/or differently positioned calibration standards such that the different types of calibration standards are made available at respective RF ports (which may be used to properly calibrate testing instrument 200). In some implementations, on some integrated circuits 300 of compound 250, the calibration standards may be associated with different ports such that each calibration standard is available at each RF port.

For example, assume that integrated circuit 300 is a first integrated circuit of compound 250. As shown in FIG. 3, on the first integrated circuit of compound 250, the short standard may be integrated at a position associated with a first RF port (e.g., an upper-left RF port), the open standard may be integrated at a position associated with a second RF port (e.g., a lower-right RF port), the load standard may be integrated at a position associated with a third RF port (e.g., an upper-right RF port), and the through standard may be integrated at a position associated with a fourth RF port (e.g., a lower-left RF port).

On a second integrated circuit 300 of compound 250, the through standard may be integrated at the position associated with the first RF port, the short standard may be integrated at the position associated with the second RF port, the open standard may be integrated at the position associated with the third RF port, and the load standard may be integrated at the position associated with the fourth RF port.

Similarly, on a third integrated circuit 300 of compound 250, the load standard may be integrated at the position associated with the first RF port, the through standard may be integrated at the position associated with the second RF port, the short standard may be integrated at the position associated with the third RF port, and the open standard may be integrated at the position associated with the fourth RF port.

On a fourth integrated circuit 300 of compound 250, the open standard may be integrated at the position associated with the first RF port, the load standard may be integrated at the position associated with the second RF port, the through standard may be integrated at the position associated with the third RF port, and the short standard may be integrated at the position associated with the fourth RF port.

In this way, integrated circuits 300 of compound 250 may allow each calibration standard to be made available at each RF port. Continuing with the above example, during calibration, prober 225 may move compound 250 such that the first integrated circuit 300 makes contact with probes 220 for a first calibration measurement, may then move compound 250 such that the second integrated circuit 300 makes contact with probes 220 for a second calibration measurement, may then move compound 250 such that the third integrated circuit 300 makes contact with probes 220 for a third calibration measurement, and may then move compound 250 such that the fourth integrated circuit 300 makes contact with probes 220 for a fourth calibration measurement. The first, second, third, and fourth calibration measurements may then be used to calculate correction parameters for calibrating testing instrument 200 (e.g., based on a selected calibration method, such as SOLT in the case of FIG. 3).

Additionally, or alternatively, the calibration standards may be integrated such that multiple calibration standards are available via an RF port of integrated circuit 300. For example, on an integrated circuit 300 of compound 250, the short standard, the open standard, the load standard, and the through standard may be integrated such that, at a first time (e.g., during a first measurement), the short standard is available to a first RF port, the open standard is available to a second RF port, the load standard is available to a third RF port, and the through standard is available to a fourth RF port. In this example, integrated circuit 300 may include a set of switches that allow additional measurements to be taken using the same integrated circuit 300. For example, a set of switches of integrated circuit 300 may be configured (e.g., opened or closed) such that, at a second time (e.g., for a second measurement), the open standard is available to the first RF port, the load standard is available to the second RF port, the through standard is available to the third RF port, and the short standard is available to the fourth RF port. In other words, in some implementations, the calibration standards may be switched between RF ports of integrated circuit 300. This switching may be repeated until each calibration standard is made available to each of the four RF ports (e.g., such that four measurements may be taken at each port, where each measurement is associated with a different calibration standard).

In some implementations, since the calibration standards integrated in the semiconductor layer of compound 250 may be designed with any impedance (e.g., 40 Ohms, 75 Ohms, etc.), a need for using matching structures during a subsequent measurement by testing instrument 200 may be eliminated (e.g., since typically available calibration standards with, for example, 50 Ohm impedance need not be used).

As indicated above, FIG. 3 is provided merely as an example. Positions, arrangements, and/or orientations of calibration standards and/or other components of integrated circuit 300 shown in FIG. 3 are provided only to facilitate an understanding of how calibration standards may be implemented on compound 250. In other words, other examples are possible and may differ from what was described with regard to FIG. 3.

FIG. 4 is a flow chart of an example process 400 for calibrating testing instrument 200 using compound 250 including a set of integrated circuits with calibration standards integrated at a semiconductor layer. In some implementations, one or more process blocks of example process 400 may be performed by one or more devices of testing instrument 200.

As shown in FIG. 4, process 400 may include loading a compound in a testing instrument, the compound including a set of integrated circuits with calibration standards integrated at a semiconductor layer (block 410). For example, testing instrument 200 may load compound 250 into testing instrument 200. Compound 250 may include a set of integrated circuits with calibration standards integrated at a semiconductor layer, as described above. In some implementations, as described above, the calibration standards may be designed such that the calibration standards have an impedance that matches a DUT (e.g., to be tested at a later time). Additionally, the set of integrated circuits may be packaged in a same package type and a same technology as the DUT.

In some implementations, compound 250 may be loaded into testing instrument 200 in order to calibrate testing instrument 200 using vector-error correction. In some implementations, testing instrument 200 may be calibrated using a vector-error correction process. The vector-error correction process may characterize systematic errors, associated with testing instrument 200, by measuring the known calibration standards of compound 250. Here, a deviation from an expected result, associated with the calibration standards, may be due to the systematic errors associated with testing instrument 200. Effects of the systematic errors may be removed from subsequent measurements once the errors are quantified (i.e., after testing instrument 200 is calibrated to remove the errors). In some implementations, the errors may be expressed as vectors since the errors have a magnitude component and a phase component. In some implementations, the calibration process may measure multiple (e.g., three, four, etc.) calibration standards in order to determine magnitude and phase of the various errors (e.g., since testing instrument 200 may be affected by more than one cause of measurement error).

As further shown in FIG. 4, process 400 may include performing a set of calibration measurements on each integrated circuit of the set of integrated circuits (block 420). For example, testing instrument 200 may perform a set of calibration measurements on one or more integrated circuits of the set of integrated circuits. In some implementations, prober 225 may move such that probes 220 make contact with the one or more integrated circuits of the set of integrated circuits in order to perform the set of calibration measurements, as described above.

In some implementations, testing instrument 200 may perform the set of calibration measurements by moving probes 220 and/or prober 225 such that probes 220 make contact with electrical access points (e.g., balls, leads, etc.) at RF ports of one or more integrated circuits 300 on compound 250. For example, probes 220 may make contact with electrical access points at RF ports of a first integrated circuit 300 (e.g., each corresponding to a calibration standard of the first integrated circuit 300), and perform a first calibration measurement based on providing a voltage signal via the RF ports of the first integrated circuit 300.

Testing instrument 200 may then move probes 220 and/or prober 225 such that probes 220 make contact with electrical access points at RF ports of a second integrated circuit 300 on compound 250 (e.g., an integrated circuit 300 with different calibration standards and/or differently arranged calibration standards than the first integrated circuit, etc.). Testing instrument 200 may perform a second calibration measurement based on providing a voltage signal via the RF ports of the second integrated circuit 300. Testing instrument 200 may continue this process (e.g., for additional integrated circuits) until sufficient calibration measurements are performed. In some implementations, the quantity of calibration measurements may depend on the calibration method associated with compound 250 (e.g., SOLT, TRL, LRM, LRRM, SOLR, SOL, SO, etc.).

As another example, calibration measurements may be performed using a single integrated circuit 300, as described above (e.g., when the calibration standards may be switched between RF ports of integrated circuit 300).

As further shown in FIG. 4, process 400 may include calculating calibration parameters, associated with the testing instrument, based on the set of calibration measurements (block 430). For example, testing instrument 200 may calculate calibration parameters, associated with testing instrument 200, based on the set of calibration measurements. In some implementations, the calculation of the calibration parameters may be based on a calibration method associated with the calibration standards, such as SOLT, TRL, LRM, LRRM, SOLR, SOL, SO, or the like.

Here, since compound 250 includes the calibration standards at the semiconductor layer, as described above, the reference plane for the calibration of testing instrument 200 is at the semiconductor layer (e.g., rather than the electrical access layer).

As further shown in FIG. 4, process 400 may include applying the calibration parameters to a S-parameter measurement associated with a DUT (block 440). For example, testing instrument 200 may apply the calibration parameters to a S-parameter measurement associated with a DUT.

As an example, testing instrument 200 may measure S-parameters of the DUT (e.g., after testing instrument 200 determines the calibration parameters). Here, due to the use of compound 250 with calibration standards that have an impedance that matches the DUT, testing instrument 200 may measure the S-parameters without use of matching structures. In this example, testing instrument 200 may apply the correction parameters to the measured S-parameters in order to increase the accuracy of the measured S-parameters. Further, the reference plane being located at the semiconductor layer may allow for improved comparability associated with measurements of testing instrument 200, improved detection of a package defect associated with the DUT, and/or improved characterization of a voltage signal chain associated with the measurement.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

Implementations described herein may allow a testing instrument to be calibrated to a reference plane at a location for which the testing instrument does not have physical access (e.g., a semiconductor layer of the package) for measurement of S-parameters. This may allow for improved comparability associated with measurements of the testing instrument, improved detection of a package defect, and/or improved characterization of a voltage signal chain associated with the measurement. Implementations described herein may also enable calibrated S-parameter measurements for a package with an arbitrary impedance, thereby eliminating a need for matching structures in the measurement path.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, and/or a combination of hardware and software.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related items, and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A compound, comprising:
    a set of integrated circuits,
        an integrated circuit, of the set of integrated circuits, including:
            an electrical access layer,
            a silicon layer, and
            calibration standards integrated at the silicon layer,
                the integrated circuit being included in a package, and
                a calibration standard, of the calibration standards, being available to at least one radio frequency (RF) port of a set of ports of the integrated circuit.

2. The compound of claim 1, where the calibration standards permit a set of measurements, associated with calibrating a testing instrument, to be performed at the silicon layer.

3. The compound of claim 1, where the silicon layer is not physically accessible by a testing instrument.

4. The compound of claim 1, where a first integrated circuit, of the set of integrated circuits, includes a first calibration standard of a particular type at a first position associated with a first port, and
    where a second integrated circuit, of the set of integrated circuits, includes a second calibration standard of the particular type at a second position associated with a second port,
        the first position being different from the second position.

5. The compound of claim 1, where terminals of the integrated circuit comprise an impedance that is other than 50 Ohms.

6. The compound of claim 1, where a package type of the package associated with the integrated circuit is a same package type as a package type of a package associated with a device-under-test (DUT),
    the DUT being another integrated circuit of the set of integrated circuits.

7. The compound of claim 6, where the DUT includes a monolithic microwave integrated circuit (MMIC).

8. The compound of claim 1, where the package is an Embedded Wafer Level Ball Grid Array (eWLB) based package.

9. The compound of claim 1, where the calibration standards are associated with at least one of:
    a short-open-load-through (SOLT) calibration method;
    a through-reflect-line (TRL) calibration method;
    a line-reflect-match (LRM) calibration method;
    a line-reflect-reflect-match (LRRM) calibration method;
    a short-open-load-reflect (SOLR) calibration method;
    a short-open-load (SOL) calibration method; or
    a short-open (SO) calibration method.

10. An integrated circuit associated with calibrating a testing instrument, the integrated circuit comprising:

an electrical access layer;
a semiconductor layer; and
a set of calibration standards integrated at the semiconductor layer,
the semiconductor layer being lower than a surface of a package of the integrated circuit, and
at least one of the set of calibration standards being coupled to a radio frequency (RF) port of a set of ports of the integrated circuit,
the set of ports permitting a set of measurements to be made relating to the set of calibration standards.

11. The integrated circuit of claim 10, where the set of calibration standards permits the set of measurements to be performed at the semiconductor layer,
the set of measurements being associated with calibrating the testing instrument.

12. The integrated circuit of claim 10, where the semiconductor layer is not physically accessible by the testing instrument.

13. The integrated circuit of claim 10, where the set of calibration standards includes a first calibration standard of a first type at a first position associated with a first port of the set of ports, and a second calibration standard of a second type at a second position associated with a second port of the set of ports.

14. The integrated circuit of claim 10, where the set of calibration standards includes a set of three different calibration standards.

15. The integrated circuit of claim 10, where the set of calibration standards includes a set of four different calibration standards.

16. The integrated circuit of claim 10, further comprising:
a switch configured to switch a calibration standard, of the set of calibration standards, between a first port of the set of ports and a second port of the set of ports.

17. A method, comprising:
performing, by a device, a set of calibration measurements using a set of integrated circuits on a compound,
an integrated circuit, of the set of integrated circuits, including:
an electrical access layer,
a silicon layer, and
a plurality of calibration standards integrated at the silicon layer,
the plurality of calibration standards permitting a calibration measurement, of the set of calibration measurements, to be performed at the silicon layer, and
a calibration standard, of the plurality of calibration standards, being associated with at least one radio frequency (RF) port of a set of ports of the integrated circuit;
calculating, by the device and based on the set of calibration measurements, correction parameters associated with calibrating a testing instrument; and
applying, by the device, the correction parameters to a measurement associated with the testing instrument.

18. The method of claim 17, where performing the set of calibration measurements includes:
performing the calibration measurement, at the silicon layer, using one or more of the plurality of calibration standards.

19. The method of claim 17,
where performing the set of calibration measurements includes:
performing the calibration measurement using the at least one RF port.

20. The method of claim 17, where performing the set of calibration measurements includes:
performing a first calibration measurement, at the silicon layer, using a first calibration standard of the plurality of calibration standards,
performing a second calibration measurement, at the silicon layer, using a second calibration standard of the plurality of calibration standards, and
performing a third calibration measurement, at the silicon layer, using a third calibration standard of the plurality of calibration standards.

* * * * *